(12) United States Patent
Negley

(10) Patent No.: US 7,202,181 B2
(45) Date of Patent: Apr. 10, 2007

(54) ETCHING OF SUBSTRATES OF LIGHT EMITTING DEVICES

(75) Inventor: Gerald H. Negley, Carrboro, NC (US)

(73) Assignee: Cres, Inc., Durham, NC (US)

( * ) Notice: Subject to any disclaimer, the term of this patent is extended or adjusted under 35 U.S.C. 154(b) by 356 days.

(21) Appl. No.: 10/811,350

(22) Filed: Mar. 26, 2004

(65) Prior Publication Data

US 2005/0215000 A1    Sep. 29, 2005

(51) Int. Cl.
H01L 21/302 (2006.01)
H01L 21/461 (2006.01)

(52) U.S. Cl. .................. 438/745; 438/20; 438/712; 257/E21; 257/54; 257/229

(58) Field of Classification Search ........... 438/745, 438/712, 20, 21, 25, 26, 40, 42, 706, 708, 438/673, 983
See application file for complete search history.

(56) References Cited

U.S. PATENT DOCUMENTS

| | | | |
|---|---|---|---|
| 4,918,497 A | 4/1990 | Edmond | 257/77 |
| 4,966,862 A | 10/1990 | Edmond | 438/27 |
| 5,027,168 A | 6/1991 | Edmond | 257/103 |
| 5,210,051 A | 5/1993 | Carter, Jr. | 438/22 |
| 5,338,944 A | 8/1994 | Edmond et al. | 257/76 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 438/45 |
| 5,631,190 A | 5/1997 | Negley | 438/33 |
| 5,739,554 A | 4/1998 | Edmond et al. | 257/103 |
| 5,912,477 A | 6/1999 | Negley | 257/95 |
| 6,084,175 A * | 7/2000 | Perry et al. | 136/256 |
| 6,120,600 A | 9/2000 | Edmond et al. | 117/89 |
| 6,187,606 B1 | 2/2001 | Edmond et al. | 438/46 |
| 6,201,262 B1 | 3/2001 | Edmond et al. | 257/77 |
| 6,214,107 B1 | 4/2001 | Kitabatake | 117/95 |
| 6,885,033 B2 * | 4/2005 | Andrews | 257/79 |
| 6,893,892 B2 * | 5/2005 | Gole et al. | 438/48 |
| 2001/0040245 A1 | 11/2001 | Kawai | |
| 2002/0123164 A1 | 9/2002 | Slater | 257/99 |
| 2003/0006418 A1 | 1/2003 | Emerson | 257/79 |
| 2004/0056260 A1 | 3/2004 | Slater, Jr. et al. | 257/79 |

FOREIGN PATENT DOCUMENTS

| | | |
|---|---|---|
| DE | 35 06 995 A1 | 8/1986 |
| GB | 822 251 A | 12/1959 |

OTHER PUBLICATIONS

Wet 7 Dry Etch of SiC, 2002.*
Pearton, S.J., "Wet and Dry Etching of SiC," *Process Technology for Silicon Carbide Devices*, pp. 85-92. Ch. 4 (2002).
Alok et al. "A Novel Method for Etching Trenches in Silicon Carbide" *Journal of Electronic Materials* 24(4): 311-314 (1995).
Dogan et al. "4H-SiC Photoconductive Switching Devices for Use in High-Power Applications" *Applied Physics Letters* 82(18): 3107-3109 (2003).
International Search Report and Written Opinion of the International Searching Authority for International Application No. PCT/US2005/001934 mailed on May 31, 2005.

* cited by examiner

*Primary Examiner*—David Nhu
(74) *Attorney, Agent, or Firm*—Myers Bigel Sibley & Sajovec, PA

(57) ABSTRACT

Fabrication of a light emitting device includes etching of a substrate of the light emitting device. The etch may be an aqueous etch sufficient to increase an amount of light extracted through the substrate. The etch may be a direct aqueous etch of a silicon carbide substrate. The etch may remove damage from the substrate that results from other processing of the substrate, such as damage from sawing the substrate. The etch may remove an amorphous region of silicon carbide in the substrate.

46 Claims, 3 Drawing Sheets

ETCHING OF SUBSTRATES OF LIGHT EMITTING DEVICES

FIELD OF THE INVENTION

This invention relates to semiconductor light emitting devices and fabricating methods therefor.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes a semiconductor light emitting element having one or more semiconductor layers that are configured to emit coherent and/or incoherent light upon energization thereof. As is well known to those having skill in the art, a light emitting diode or laser diode generally includes a diode region on a microelectronic substrate. The microelectronic substrate may be, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

Published U.S. Patent Application No. 2002/0123164, the disclosure of which is incorporated herein as if set forth in its entirety, describes light emitting diodes that include a substrate having first and second opposing faces and that is transparent to optical radiation in a predetermined wavelength range and that is patterned to define, in cross-section, a plurality of pedestals that extend into the substrate from the first face towards the second face. A diode region on the second face is configured to emit light in the predetermined wavelength range, into the substrate upon application of voltage across the diode region. A mounting support on the diode region, opposite the substrate is configured to support the diode region, such that the light that is emitted from the diode region into the substrate, is emitted from the first face upon application of voltage across the diode region. The first face of the substrate may include therein a plurality of grooves that define a plurality of triangular pedestals in the substrate. The grooves may include tapered sidewalls and/or a beveled floor. The first face of the substrate also may include therein an array of via holes. The via holes may include tapered sidewalls and/or a floor.

In GaP light emitting devices, the devices have been conventionally singulated using a two-step sawing process. To define a mesa of the GaP device, a first series of wide saw blade saw cuts is made in a wafer of GaP device and then the saw cuts are etched using a GaP aqueous etchant to remove damage from the saw cut. Subsequent saw cuts are then made using a thinner saw blade to singulate the GaP devices.

Techniques for dry etching laser light cut light emitting diodes are described in U.S. Pat. No. 5,912,477, the disclosure of which is incorporated herein by reference as if set forth fully herein.

SUMMARY OF THE INVENTION

Some embodiments of the present invention provide for fabrication of a light emitting device including a silicon carbide substrate having first and second opposing faces and a light emitting element on a first face of the substrate by directly etching the second face of the silicon carbide substrate using an aqueous etch to remove a damaged portion of the substrate resulting from processing of the substrate. The damaged portion of the second face of the silicon carbide substrate may result from sawing the substrate, lapping the substrate, polishing the substrate, implantation in the substrate and/or laser processing the substrate.

In certain embodiments of the present invention, directly etching the second face of the silicon carbide substrate is carried out subsequent to singulation of the light emitting device from a wafer. In other embodiments of the present invention, directly etching the second face of the silicon carbide substrate is carried out prior to singulation of the light emitting device from a wafer.

In some embodiments of the present invention, the aqueous etch is an etch with $KOH:K_3Fe(CN)_6$.

In additional embodiments of the present invention, directly etching the second face of the silicon carbide substrates includes etching a carbon-faced surface of the silicon carbide substrate and/or etching a non-carbon-faced surface of the silicon carbide substrate. The carbon-faced surface may be a sidewall of the substrate.

In certain embodiments of the present invention, directly etching the second face of the silicon carbide substrate includes directly etching a surface oblique to the second face of the silicon carbide substrate.

In further embodiments of the present invention, light output of a light emitting device is increased by etching a substrate of the light emitting device using an aqueous etch to remove a light absorption region of the substrate of the light emitting device. The light absorption region may correspond to a region of the substrate damaged by processing the substrate in fabrication of the light emitting device. For example, the region of the substrate damaged by processing the substrate may correspond to a saw groove in the substrate. The region of the substrate damaged by processing the substrate could also correspond to a lapped, polished and/or laser processed region of the substrate.

In certain embodiments of the present invention, the substrate is a silicon carbide substrate. Furthermore, etching a substrate may include etching a carbon face of the silicon carbide substrate and/or etching a non-carbon face of the silicon carbide substrate.

In additional embodiments of the present invention, the substrate is a sapphire substrate.

In some embodiments of the present invention, etching the substrate is carried out subsequent to singulation of the light emitting device. The aqueous etch may include etching with $KOH:K_3Fe(CN)_6$. The aqueous etch may be carried out for at least about 50 minutes. The aqueous etch may be carried out at a temperature of at least about 80° C. Furthermore, etching a substrate may be provided by directly etching the substrate.

In yet other embodiments of the present invention, fabrication of a light emitting device includes etching a substrate of the light emitting device using an aqueous etch having etching parameters that are sufficient to increase an amount of light extracted through the substrate. The etch of the substrate may include etching the substrate to remove at least a portion of a region of the substrate damaged by processing the substrate in fabrication of the light emitting device. The region of the substrate damaged by processing the substrate may correspond to a saw groove in the substrate. The region of the substrate damaged by processing the substrate could also correspond to a lapped, polished, implanted and/or laser processed region of the substrate.

In particular embodiments of the present invention, the substrate is a silicon carbide substrate. Etching the substrate may include etching a carbon face of the silicon carbide substrate and/or etching a non-carbon face of the silicon carbide substrate. The carbon face of the substrate may be a carbon faced sidewall of the substrate.

In certain embodiments of the present invention, the substrate is a sapphire substrate.

In some embodiments of the present invention, etching the substrate sufficient to increase an amount of light extracted through the substrate is carried out subsequent to singulation of the light emitting device. The aqueous etch may include etching with $KOH:K_3Fe(CN)_6$. The aqueous etch may be carried out for at least about 50 minutes. The aqueous etch may also be carried out at a temperature of at least about 80° C. Etching the substrate sufficient to increase an amount of light extracted through the substrate may include directly etching the substrate.

In additional embodiments of the present invention, fabricating a light emitting device includes etching a silicon carbide substrate of the light emitting device using an aqueous etch to remove at least a portion of amorphous silicon carbide from a surface of the silicon carbide substrate of the light emitting device. The amorphous silicon carbide may correspond to a region of the substrate damaged by processing the substrate in fabrication of the light emitting device. The region of the substrate damaged by processing the substrate may correspond to a saw groove in the substrate, a lapped, polished, implanted and/or laser processed region of the substrate.

In further embodiments of the present invention, etching a silicon carbide substrate of the light emitting device to remove at least a portion of amorphous silicon carbide from a surface of the silicon carbide substrate is carried out subsequent to singulation of the light emitting device.

The aqueous etch may include etching with $KOH:K_3Fe(CN)_6$. The aqueous etch may be carried out for at least about 50 minutes. The aqueous etch may be carried out at a temperature of at least about 80° C. Etching a silicon carbide substrate of the light emitting device to remove at least a portion of amorphous silicon carbide from a surface of the silicon carbide substrate may be provided by directly etching the substrate.

In still further embodiments of the present invention, fabricating a light emitting device includes sawing a silicon carbide substrate of the light emitting device and etching at least one sawn surface of the silicon carbide substrate of the light emitting device. Etching at least one sawn surface may include etching a carbon face of the silicon carbide substrate and/or etching a non-carbon face of the silicon carbide substrate.

In some embodiments of the present invention, etching at least one sawn surface is carried out subsequent to singulation of the light emitting device. Etching at least one sawn surface may also be provided by performing an aqueous etch of the substrate. The aqueous etch may include etching with $KOH:K_3Fe(CN)_6$. The aqueous etch may be carried out for at least about 50 minutes. The aqueous etch may be carried out at a temperature of at least about 80° C. Etching at least one sawn surface may include directly etching at least one sawn surface.

DETAILED DESCRIPTION

Figure 1:
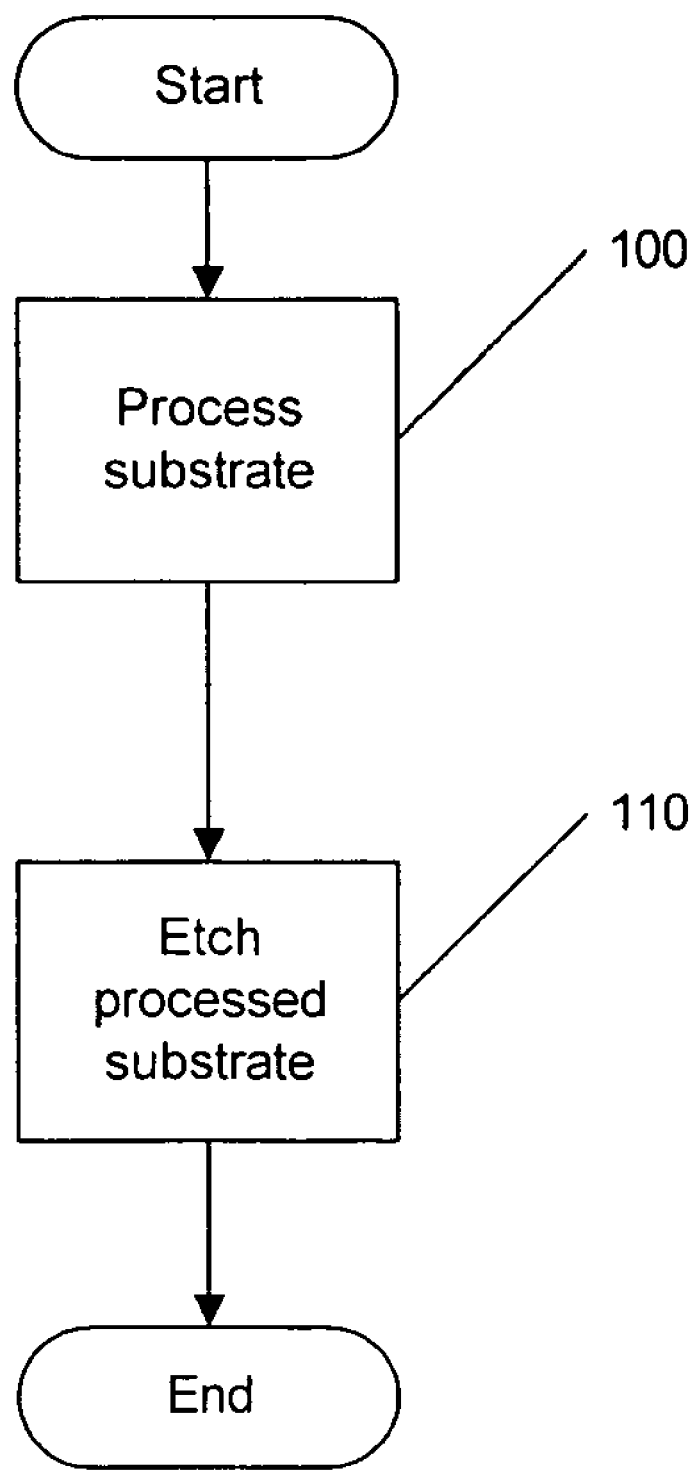
FIG. 1 is a flowchart illustrating fabrication steps according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Some embodiments of the present invention provide methods for fabricating light emitting devices by etching at least one damaged surface of a substrate of the device so as to remove at least a portion of the damaged surface. While not being bound by any particular theory of operation, it is believed that a light absorption region of the light emitting device may result from processing operations performed on the light emitting device, such as sawing the device to singulate the device and/or to create light extraction features of the device, lapping, polishing, implantation and/or laser processing the device. The light absorption region may result from damage to the substrate and/or layers of the device as a result of processing the substrate and/or layers of the device. Thus, by etching the damaged surface of the light emitting device some or all of the light absorption region may be removed, thereby increasing the light extracted from the device.

Embodiments of the present invention may be suitable for fabricating semiconductor light emitting devices, such as a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green LEDs may be provided.

For example, the light emitting devices may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled *Group III Nitride Based Light Emitting Diode Structures With a Quantum Well and Superlattice, Group III Nitride Based Quantum Well Structures and Group III Nitride Based Superlattice Structures*, published Jan. 9, 2003, as well as published U.S. Patent Publication No. US 2002/0123164 A1 entitled *Light Emitting Diodes Including Modifications for Light Extraction and Manufacturing Methods Therefor*. Furthermore, phosphor coated LEDs, such as those described in U.S. application Ser. No. 10/659,241, entitled *Phosphor-Coated Light Emitting Diodes Including Tapered Sidewalls and Fabrication Methods Therefor*, filed Sep. 9, 2003, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Methods of fabricating light emitting devices according to some embodiments of the present invention are illustrated in FIG. 1. As seen in FIG. 1, a substrate of a light emitting device is processed in the fabrication of the light emitting device (block 100). This processing results creating a light absorption region in the substrate such that, in operation, at least some light is absorbed in the substrate by the light absorption region. As discussed above, this light absorption region may result from damage to the substrate resulting from the processing of the substrate. For example, the processing of the substrate may result in an amorphous region of the substrate being formed.

The processed substrate is then etched in an aqueous etch (block 110). The etch may remove some or all of the light absorption region and/or damaged region resulting from the processing of the substrate. For example, if the processing of the substrate results in an amorphous region, some or all of the amorphous region may be removed. By etching substrates of light emitting devices after processing the substrates, the light output of the light emitting device may be increased. For example, as discussed below, for silicon carbide substrates with gallium nitride based light emitting elements, the light output of the light emitting device has been found to increase as a result of aqueous etching the device after the device has been sawn to provide light extraction features in the substrate of the light emitting device.

In particular embodiments of the present invention, the substrate is a silicon carbide substrate. In other embodiments of the present invention, the substrate is a sapphire substrate. The processing of the silicon carbide substrate may include sawing the silicon carbide substrate, for example, to provide light extraction features in the silicon carbide substrate and/or to singulate the light emitting device from a wafer that includes multiple light emitting devices. The processing of the silicon carbide substrate could also include laser processing of the light emitting substrate, for example to provide laser ablation, feature patterning and/or singulation of the light emitting device. The processing of the silicon carbide substrate could also include lapping and/or polishing of the substrate. Processing the silicon carbide substrate could also include implantation in the silicon carbide substrate. The processing of the silicon carbide substrate may occur before, during or after formation of a light emitting element on the substrate.

The etching of the substrate may be provided by any suitable etching technique capable of etching the substrate. In particular embodiments of the present invention where the substrate is silicon carbide, the etch may be any etch capable of etching silicon carbide. An aqueous etch may be carried out in a multi-wafer manner before or after singulation and, therefore, may be more amenable to scaling to commercial production. Accordingly, in some embodiments of the present invention, the etch is an aqueous etch. For example, the etch may be an etch with $KOH:K_3Fe(CN)_6$. A suitable etchant is provided by Transene Corporation of Rowley, Massachusetts, as a GaP etchant. Suitable etchants for sapphire may include, for example, $H_3PO_4$ and/or a mixture of $H_3PO_4:H_2SO_4$.

In some embodiments, the silicon carbide is directly etched. As used herein, directly etched refers to etching the silicon carbide to remove silicon carbide without first converting the silicon carbide to another material, such as an oxide. In some embodiments, the light absorbing region may first be converted to an oxide and then the oxide removed. Techniques using a sacrificial oxide to remove damaged silicon carbide are well known and, therefore, will not be described further herein. See e.g., Chapter 4, "Process Technology for Silicon Carbide Devices" by Carl-Mikael Zetterling (2002); see also, U.S. Pat. No. 6,214,107, the disclosure of which is incorporated herein by reference as if set forth in its entirety. Use of a sacrificial oxide for damage removal may be difficult in practice, however, where the devices are etched after singulation because of the high temperatures typically utilized to oxidize silicon carbide may melt the blue tape or other carrier to which the devices are attached.

The particular conditions under which the etch is carried out may depend on the etching agent utilized, the nature of the processing that caused the damage, the characteristics of the light absorption/damaged region and/or the amount of substrate material to be removed. Such condition may, for example, be selected for a particular processing operation by, for example, experimentally determining light output of similarly processes devices using differing etching conditions (e.g. time and/or temperature) and selecting etching conditions based on the light output. However, in particular embodiments of the present invention where the substrate is silicon carbide, the damage results from sawing the substrate and the etch is carried out with $KOH:K_3Fe(CN)_6$, the etch may be carried out at a temperature of at least about 80° C., for example, from about 80 to 90° C. for at least about 50 minutes, for example, from about 50 minutes to about one hour. Other times and/or temperatures may also be used. Accordingly, embodiments of the present invention should not be construed as limited to the particular exemplary etching parameters described herein.

In some embodiments of the present invention, the etching etches a carbon face of the silicon carbide substrate and/or a non-carbon face of the silicon carbide substrate. The etching may also etch a surface of the substrate that is oblique to a surface of the substrate opposite the surface of the substrate on which the light emitting element is formed. As used herein, oblique refers to a surface that is non-parallel to a reference surface.

Figure 2:
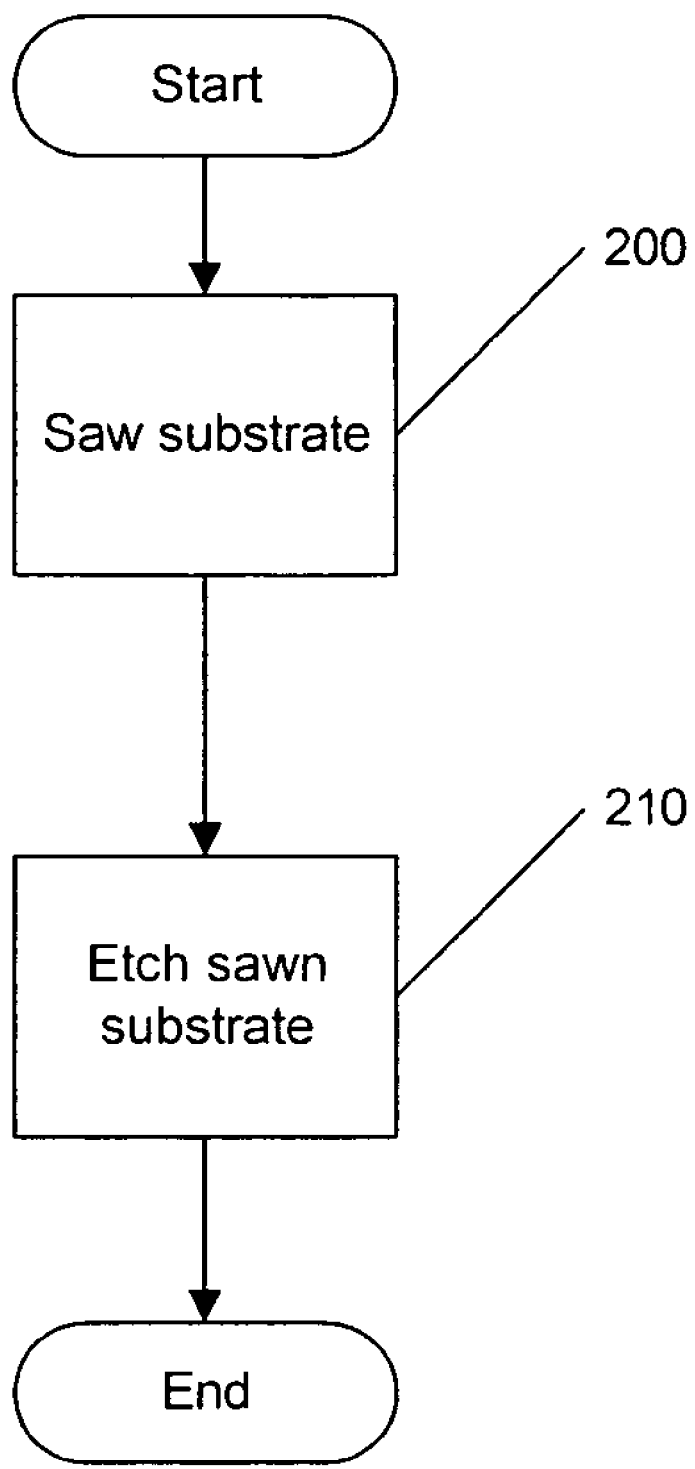
FIG. 2 is a flowchart illustrating fabrication steps according to further embodiments of the present invention.

FIG. 2 is a flowchart illustrating fabrication steps according to some embodiments of the present invention. As seen in FIG. 2, a substrate of a light emitting device is sawn to provide light extraction features and/or to singulate devices on a wafer (block 200). This processing results creation of a light absorption region in the substrate such that, in operation, at least some light is absorbed in the substrate by the light absorption region in the substrate. As discussed above, this light absorption region may result from damage to the substrate resulting from the sawing of the substrate. For example, the sawing of the substrate may result in an amorphous region of the substrate being formed.

At least one sawn surface of the substrate is then etched (block 210). The etch may be carried out so as to remove some or all of the light absorption region and/or damaged region resulting from the processing of the substrate. For example, if the sawing of the substrate results in an amorphous region, some or all of the amorphous region may be removed. By etching substrates of light emitting devices after the substrates are sawn, the light output of the light emitting device may be increased.

In some embodiments of the present invention, the etch of the sawn surface is a dry etch and/or an aqueous etch. In particular embodiments of the present invention, the etch is an Inductively Coupled Plasma (ICP) etch. However, an ICP etch is typically carried out on a wafer-by-wafer basis and, therefore, may present difficulties in scaling to commercial production. An aqueous etch may be carried out in a multi-wafer manner before or after singulation and, therefore, may be more amenable to scaling to commercial production. Accordingly, in some embodiments of the present invention, the etch is an aqueous etch. For example, the etch may be an etch with $KOH:K_3Fe(CN)_6$. A suitable etchant is provided by Transene Corporation of Rowley, Mass., as a GaP etchant. Suitable etchants for sapphire may include, for example, $H_3PO_4$ and/or a mixture of $H_3PO_4$: $H_2SO_4$.

The etch of the sawn substrate may occur before or after singulation of the devices. In some embodiments of the present invention, a blue tape or other carrier is applied to the wafer, the wafer is then sawn to singulate the devices and then etched while the singulated devices remain on the blue tape. The devices may also be sawn to provide light extraction features as described, for example, in published U.S. Patent Application No. US 2002/0123164 A1.

Figure 3A:
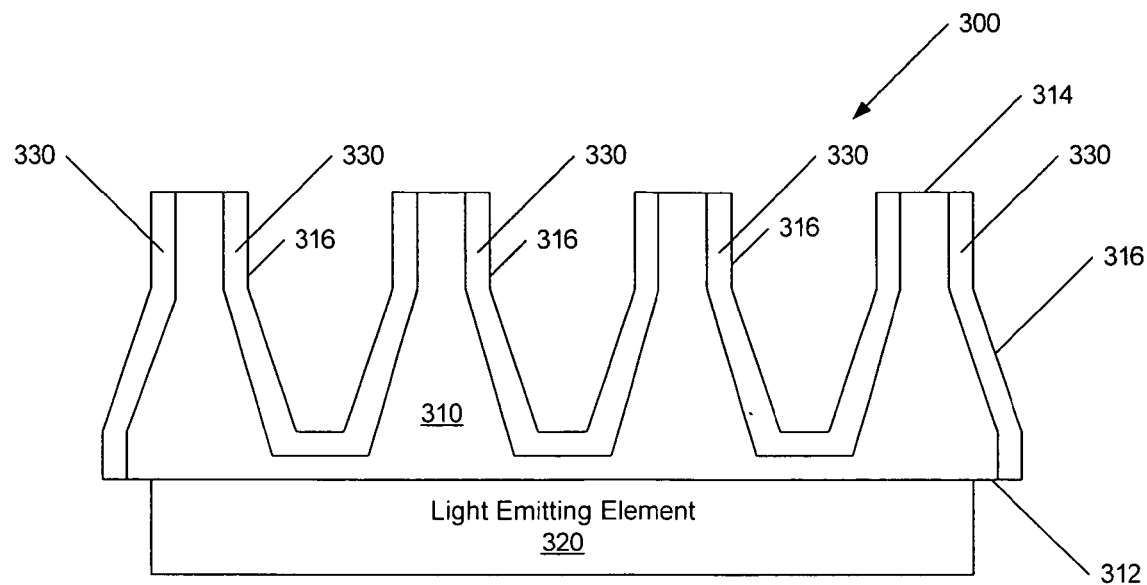
FIGS. 3A and 3B are cross-sectional views of a light emitting device before and after etching according to further embodiments of the present invention.

FIG. 3A is a cross-section of a light emitting device 300 prior to etching according to some embodiments of the present invention. As seen in FIG. 3A, a light emitting element 320 is formed on a first surface 312 of a substrate 310. As discussed above, the substrate 310 may be a silicon carbide substrate and, in particular, a single crystal silicon carbide substrate. In some embodiments of the present invention, the substrate 310 is a sapphire substrate. The substrate 310 has formed in it a plurality of light extraction features as illustrated by the trenches in a second surface 314 of the substrate 310. The second surface 314 of the substrate is opposite the first surface 312 of the substrate 310. As discussed above, the trenches may be formed, for example, by sawing the substrate 310. The trenches have sidewalls that include a surface 316 that is oblique to the second surface 314 of the substrate 310. As used herein, a sidewall of the substrate includes the outer edges of the substrate and/or sidewall of a trench or feature that terminates within the substrate or extends through the substrate. In particular embodiments of the present invention, the second surface 314 of the substrate 310 is a carbon face of a silicon carbide substrate. In such embodiments, the oblique surfaces 316 (sidewalls) may include non-carbon faces of the silicon carbide substrate (e.g. the perpendicular portion of the oblique surfaces 316) as well as carbon faces of the silicon carbide substrate (e.g. the beveled portion of the oblique surfaces 316).

As a result of the processing of the substrate 310, light absorption regions 330 may be formed in the substrate 310. The light absorption regions 330 may correspond to damaged regions of the substrate 310. In some embodiments of the present invention, the light absorption regions 330 are regions of amorphous silicon carbide. While the light absorption regions 330 are illustrated on the oblique surfaces 316, light absorption regions may also exist on other surfaces, such as on the second face 314 of the substrate 310. Furthermore, while the light absorption regions 330 are illustrated in FIG. 3A as continuous regions of substantially uniform thickness, the regions may be discontinuous and/or of non-uniform thickness.

Figure 3B:
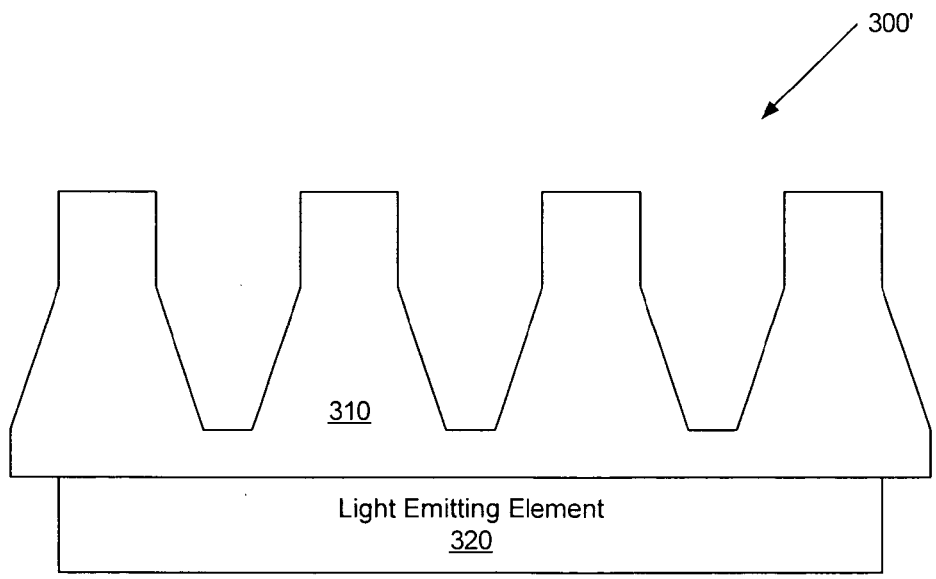

The light emitting device 300 of FIG. 3A is etched as described above to remove at least a portion of the light absorption regions 330 to provide the light emitting device 300' as illustrated in FIG. 3B. The etch of the substrate 310 etches the oblique surfaces 316 to remove at least a portion of the light absorption regions 330. Thus, the etch may etch a non-carbon face of a silicon carbide substrate and a carbon face of the silicon carbide substrate. The etch may also etch the second surface 314 and surfaces parallel to the second surface 314 (such as the bottoms of the trenches) and, therefore, the etch may etch a carbon face of the silicon carbide substrate as well.

The light emitting device 300 is etched using etching parameters that are sufficient to increase the amount of light extracted from the substrate of the light emitting device 300' to be greater than the amount of light extracted from the substrate 310 of the light emitting device 300. In some embodiments, the etch is performed to remove all of the light absorption regions 330 from the substrate 310. However, because the light absorption regions 330 may be non-uniform in thickness and/or because the location of the light absorption regions 330 may affect the light output of the light emitting device differently, some of the light absorption regions 330 may remain in the substrate 310 after etching. For example, if a one hour etch achieves 99.9 percent of the light output as a four hour etch, from a manufacturing standpoint, it may be advantageous to utilize the one hour etch rather than the four hour etch even though some of the light absorption regions 330 may remain in the substrate 310. In other embodiments of the present invention, over-etching may be performed to ensure that all of the light absorption regions 330 are removed.

The following examples are provided for illustrative purposes and are not intended to limit the scope of the present invention.

EXAMPLES

The light output of XB900, XB300 and XB500 light emitting diodes from Cree Inc., Durham, N.C., was measured before and after etching according to embodiments of the present invention. The XB900, XB300 and XB500 diodes are gallium nitride based diodes on a silicon carbide substrate. The diodes are sawn for singulation and to create light extraction features at least at the periphery of the devices.

In a first test, XB900 light emitting diodes were etched for approximately one hour in KOH:K$_3$Fe(CN)$_6$ at a temperature of from about 80 to 90° C. The light emitting diodes were encapsulated in Dymax (UV) doming on TO-18 headers. Table 1 reflects the output of the devices with a 20 mA drive current.

TABLE 1

XB900 Light Output

| Part # | Initial | After Etch | (after/initial) | Dymax er | (dymax/initial) |
|---|---|---|---|---|---|
| 1 | 8.52 | 9.98 | 1.17 | 17.2 | 2.02 |
| 2 | 8.91 | 10.6 | 1.19 | | |
| 3 | 9.29 | 10.8 | 1.16 | | |
| 4 | 8.93 | 10.3 | 1.15 | 17.6 | 1.97 |
| 5 | 8.77 | 10.1 | 1.15 | | |
| 6 | 9.13 | NO | | 16.2 | 1.77 |
| 7 | 9.22 | NO | | 16.4 | 1.78 |
| 8 | 8.95 | NO | | | |

In Table 1, the Initial column is the light output of the device prior to etching as measured in milliwatts (mW). The After Etch column is the light output of the device after etching as measured in mW. A NO in the After Etch column indicates a control group where no etching was performed. The (after/initial) column is the percent gain of a bare chip. The Dymax er column is mWs of radiant flux of Dymax encapsulated LED dice. The (dymax/initial) column is the percent gain of unetched dice/chip to encapsulated parts (indicating higher light extraction for etched parts.

XB300 light emitting diodes, XB500 light emitting diodes and XB900 light emitting diodes were also tested. The light output of the diodes was measured before and after etching in KOH:K$_3$Fe(CN)$_6$ for approximately 50 minutes. The diodes were mounted on a TO-18 header with no encapsulation. The results of the test are reflected in Table 2.

TABLE 2

XB300, XB500 and XB900 Light Output

| XB300 | | XB500 | | XB900 | |
|---|---|---|---|---|---|
| Initial | After Etch | Initial | After Etch | Initial | After Etch |
| 9.6 | 11.1 | 6.29 | 7.01 | 9.02 | 10.4 |
| 9.86 | 11.4 | 6.49 | 7.42 | 8.86 | 10.1 |
| 10.7 | 12 | 6.67 | 7.46 | 8.8 | 10.1 |

It will be understood by those having skill in the art that various embodiments of the invention have been described individually in connection with FIGS. 1–3B. However, combinations and subcombinations of the embodiments of FIGS. 1–3B may be provided according to various embodiments of the present invention.

As seen from Table 1, light output of the XB900 LEDs of Table 1 increased by approximately 13–15% after etching. As seen from Table 2, light output of the XB300 and XB900 increased approximately 15–16% and light output from the XB500 increased approximately 11–12% after etching. Thus, based on the results above, it appears that etching of the substrates of the light emitting diodes is effective in increasing the amount of light extracted through the substrate of the diodes.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a light emitting device including a silicon carbide substrate having first and second opposing faces and a light emitting element on a first face of the SiC substrate, comprising:
   directly etching the second face of the silicon carbide substrate utilizing an aqueous etch to remove a damaged portion of the SiC substrate resulting from processing of the SiC substrate.

2. The method of claim 1, wherein the damaged portion of the second face of the silicon carbide substrate results from sawing the SiC substrate, lapping the SiC substrate, polishing the SiC substrate, implantation in the SiC substrate and/or laser processing the SiC substrate.

3. The method of claim 1, wherein directly etching the second face of the silicon carbide substrate is carried out subsequent to singulation of the light emitting device from a wafer.

4. The method of claim 1, wherein directly etching the second face of the silicon carbide substrate is carried out prior to singulation of the light emitting device from a wafer.

5. The method of claim 1, wherein the aqueous etch comprises an etch with KOH:K$_3$Fe(CN)$_6$.

6. The method of claim 1, wherein directly etching the second face of the silicon carbide substrate further comprises etching a carbon-faced surface of the silicon carbide substrate.

7. The method of claim 6, wherein the carbon-faced surface of the silicon carbide substrate comprises a carbon-faced surface of a sidewall of the SiC substrate.

8. The method of claim 1, wherein directly etching the second face of the silicon carbide substrate further comprises etching a non-carbon-faced surface of the silicon carbide substrate.

9. The method of claim 1, wherein directly etching the second face of the silicon carbide substrate comprises directly etching a surface oblique to the second face of the silicon carbide substrate.

10. A method of increasing light output of a light emitting diode, comprising:
    etching a substrate of the light emitting diode using an aqueous etch to at least partially remove a light absorption region of the substrate of the light emitting diode.

11. The method of claim 10, wherein the light absorption region corresponds to a region of the substrate damaged by processing the substrate in fabrication of the light emitting diode.

12. The method of claim 11, wherein the region of the substrate damaged by processing the substrate corresponds to a saw groove in the substrate.

13. The method of claim 11, wherein the region of the substrate damaged by processing the substrate corresponds to a lapped, polished, implanted and/or laser processed region of the substrate.

14. The method of claim 10, wherein the substrate comprises a silicon carbide substrate.

15. The method of claim 14, wherein etching a substrate comprises etching a carbon face of the silicon carbide substrate.

16. The method of claim 15, wherein etching a substrate further comprises etching a non-carbon face of the silicon carbide substrate.

17. The method of claim 14, wherein etching a substrate comprises etching a carbon face sidewall of the silicon carbide substrate.

18. The method of claim 10, wherein the substrate comprises a sapphire substrate.

19. The method of claim 10, wherein etching a substrate is carried out subsequent to singulation of the light emitting diode.

20. The method of claim 10, wherein the aqueous etch comprises etching with $KOH:K_3Fe(CN)_6$.

21. The method of claim 20, wherein the aqueous etch is carried out for at least about 50 minutes.

22. The method of claim 20, wherein the aqueous etch is carried out at a temperature of at least about 80° C.

23. The method of claim 10, wherein etching a substrate comprises directly etching the substrate.

24. A method of fabricating a light emitting diode, comprising:
    etching a substrate of the light emitting diode using an aqueous etch and using etching parameters that are sufficient to increase an amount of light extracted through the substrate.

25. The method of claim 24, wherein etching a substrate comprises etching a substrate to remove at least a portion of a region of the substrate damaged by processing the substrate in fabrication of the light emitting diode.

26. The method of claim 25, wherein the region of the substrate damaged by processing the substrate corresponds to a saw groove in the substrate.

27. The method of claim 25, wherein the region of the substrate damaged by processing the substrate corresponds to a lapped, polished, implanted and/or laser processed region of the substrate.

28. The method of claim 24, wherein the substrate comprises a silicon carbide substrate.

29. The method of claim 28, wherein etching a substrate comprises etching a carbon face of the silicon carbide substrate.

30. The method of claim 29, wherein etching a substrate further comprises etching a non-carbon face of the silicon carbide substrate.

31. The method of claim 29, wherein etching a substrate further comprises etching a carbon face sidewall of the silicon carbide substrate.

32. The method of claim 24, wherein the substrate comprises a sapphire substrate.

33. The method of claim 24, wherein etching a substrate is carried out subsequent to singulation of the light emitting diode.

34. The method of claim 33, wherein the aqueous etch comprises etching with $KOH:K_3Fe(CN)_6$.

35. The method of claim 34, wherein the aqueous etch is carried out for at least about 50 minutes.

36. The method of claim 35, wherein the aqueous etch is carried out at a temperature of at least about 80° C.

37. The method of claim 34, wherein etching a substrate comprises directly etching the substrate.

38. A method of fabricating a light emitting device, comprising:
    etching a silicon carbide substrate of the light emitting device using an aqueous etch to remove at least a portion of amorphous silicon carbide from a surface of the silicon carbide substrate of the light emitting device.

39. The method of claim 38, wherein the amorphous silicon carbide corresponds to a region of the SiC substrate damaged by processing the SiC substrate in fabrication of the light emitting device.

40. The method of claim 39, wherein the region of the SiC substrate damaged by processing the SiC substrate corresponds to a saw groove in the SiC substrate.

41. The method of claim 39, wherein the region of the SiC substrate damaged by processing the SiC substrate corresponds to a lapped, polished, implanted and/or laser processed region of the SiC substrate.

42. The method of claim 38, wherein etching the SiC substrate is carried out subsequent to singulation of the light emitting device.

43. The method of claim 38, wherein the aqueous etch comprises etching with $KOH:K_3Fe(CN)_6$.

44. The method of claim 43, wherein the aqueous etch is carried out for at least about 50 minutes.

45. The method of claim 43, wherein the aqueous etch is carried out at a temperature of at least about 80° C.

46. The, method of claim 38, wherein etching a substrate comprises directly etching the substrate.

* * * * *

UNITED STATES PATENT AND TRADEMARK OFFICE
CERTIFICATE OF CORRECTION

PATENT NO. : 7,202,181 B2 Page 1 of 1
APPLICATION NO. : 10/811350
DATED : April 10, 2007
INVENTOR(S) : Negley et al.

It is certified that error appears in the above-identified patent and that said Letters Patent is hereby corrected as shown below:

On Title Page,

Item (73) Correct Assignee to read --Cree, Inc.--

Signed and Sealed this

Third Day of July, 2007

JON W. DUDAS
*Director of the United States Patent and Trademark Office*